United States Patent

Geffe

[15] 3,643,183

[45] Feb. 15, 1972

[54] THREE-AMPLIFIER GYRATOR

[72] Inventor: Philip R. Geffe, Laurel, Md.

[73] Assignee: Westinghouse Electric Corporation, Pittsburgh, Pa.

[22] Filed: May 19, 1970

[21] Appl. No.: 38,709

[52] U.S. Cl. ............................ 333/80 R, 330/30 D, 330/85

[51] Int. Cl. .................................... H03h 7/44, H03h 11/00

[58] Field of Search ................ 333/80, 80 T; 330/12, 85, 139

[56] References Cited

UNITED STATES PATENTS 3,493,901 2/1970 Deboo .................................... 333/80

3,501,716 3/1970 Ferch et al. ............................ 333/80

*Primary Examiner*—Herman Karl Saalbach
*Assistant Examiner*—Paul L. Gensler
*Attorney*—F. H. Henson and E. P. Klipfel

[57] ABSTRACT

Three identical inverting amplifiers are connected in a circuit combination of two amplifiers in cascade across the remaining amplifier. The circuit configuration, accomplishes wide banding in a gyrator.

4 Claims, 4 Drawing Figures

PRIOR ART

THREE-AMPLIFIER GYRATOR

CROSS REFERENCES TO RELATED APPLICATIONS

The present invention is generally related to circuitry described and claimed in my copending application Ser. No. 828,327, filed May 27, 1969, entitled "BroadBand Gyrator Circuit;" circuitry described and claimed in my copending application Ser. No. 38,710, filed May 19, 1970, (W.E. Case No. 41,308), entitled "A Broadbanded Voltage-To-Current Converter;" both applications being assigned to the present assignee.

BACKGROUND OF THE INVENTION

1. Field of the Invention

The present invention relates generally to gyrators and more particularly relates to a wide band gyrator utilizing three identical amplifiers.

2. Description of the Prior Art

The ideal gyrator, when loaded at one port with a capacitor, would have a zero resistance and an admittance which is constant at the other port. In such a manner, a pure inductance would appear at the output port when the gyrator is loaded with a capacitance at its input port. At the same time it is desirable that a gyrator utilize the fewest number of circuit components. Such components should also be capable of being economically and efficiently manufactured in monolithic form.

Although loading one port with a capacitor causes the other port to behave like an inductor, the effective inductance is associated with a negative series resistance whose magnitude increases with the square of the frequency. If the magnitude of the negative resistance is unbounded, networks using such a gyrator can achieve only conditional stability at best. The problems resulting from a pure negative resistance occurring in a gyrator is more fully set forth in my article entitled "Gyrator Bandwidth Limitations," *IEEE Transactions on Circuit Theory*, page 501, Dec. 1968.

Prior art circuitry attempting to solve these problems requires a large number of circuit components and, in monolithic form, a large chip size, with a consequent decrease in the manufacturing yield.

SUMMARY OF THE INVENTION

Briefly, the present invention provides a gyrator of three identical amplifiers with substantially the same single dominant pole and each being of the inverting type with high input and output impedances. The second and third amplifiers are connected in cascade combination across the first amplifier. A gain-controlling resistor connects the common junction of the second and third amplifiers to a point of reference potential. The excursion of the negative resistance (when the gyrator is used to provide inductance) is bounded so that, when desired, a small positive resistance may be placed in the external circuit of the gyrator to produce unconditional stability at all frequencies.

BRIEF DESCRIPTION OF THE DRAWING

Further objects and advantages of the present invention will be readily apparent from the following detailed description taken in conjunction with the drawing in which.

DESCRIPTION OF THE PREFERRED EMBODIMENT

Figure 1:
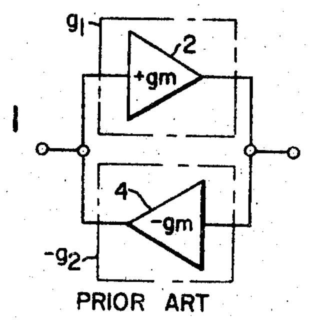
FIG. 1 is a schematic diagram of the prior art.

Prior art circuitry for attaining an ideal gyrator is as illustrated in FIG. 1. A gyrator is a nonreciprocal two-port device, having an input impedance which is proportional to its load admittance. Hence, one port of the gyrator behaves like an inductance when the other port is loaded with a capacitance. Referring to the prior art circuitry of FIG. 1, the gyrator is made by paralleling two transconductances $g_1$ and $-g_2$. The first transconductance $g_1$ is a transistorized noninverting amplifier the frequency response of which has a single dominant pole and which further has a high input and a high output impedance. The negative transconductance $-g_2$ utilizes an inverting amplifier 4 similar to the amplifier 2.

The present invention attains a much higher integrated circuit yield by utilizing three identical amplifiers. Each of the amplifiers 12, 14 and 16 is selected to be of the inverting type with high input and output impedances and has a frequency response containing substantially the same single dominant pole. A resistor 18 connects the common junction 19 of the cascaded amplifiers 14 and 16 to a point of reference potential or ground 20.

The resistor 18 of magnitude $R_m$ converts the amplifier 16 into an inverting voltage amplifier. Further, since the resistor 18 can be mounted external to the integrated circuit, its temperature coefficient of resistance can be chosen to compensate gain drift. The voltage at node 19 is proportional to $R_m$, so $R_m$ adjusts the gain (or $g_m$) of 16.

Additionally, the present invention alleviates the negative-resistance problem which arises in the prior art circuitry of FIG. 1. Suppose that one port 22 is loaded with a capacitance, $C_o$ as indicated at 24. Then the impedance looking into the other port 26 will be $$Z_{11}=\frac{C_oS}{g_1g_2} \quad (1)$$

where $S=j\omega$ is the frequency variable; $g_1$, is the magnitude of the forward transconductance of the gyrator; and $g_2$ is the magnitude of the backward transconductance. If the magnitude of the resistor 18 is chosen to be identified as $R_m$ to give the amplifier 16 a unity voltage gain, then:

$$g_1=\frac{|g_m|}{S+1} \quad (2)$$

$$g_2=\frac{|g_m|}{(S+1)^2} \quad (3)$$

where the transconductance bandwidth is normalized for $\omega_c=1$, $\omega_c$ being the 3 db. down frequency.

Substituting these equations into Equation (1) gives $$Z_{11}=\left(\frac{C_o}{g_m^2}\right)S(S+1)^3=LS(S+1)^3 \quad (4)$$

where $$L=\frac{C_o}{g_m^2} \quad (5)$$

The impedance can then be shown to have a resistance $R_o$ and a reactance $X_o$ such that $$\frac{Z_{11}(j\omega)}{L}=R_o+j\omega X_o \quad (6)$$

For the input impedance $Z_{11}$ to be an ideal inductance it would be necessary for the resistance $R_o$ to be zero and the reactance $X_o$ to be a constant. At the 3 db. down frequency normalized at unity, the resistance $R_o$ will have a value $$R_o=\omega^2(\omega^2-3) \quad (7)$$

Hence, it can be seen that the resistor $R_o$ has a magnitude of zero at zero frequency. As the angular frequency $\omega$ increases, the resistance becomes more negative until, at a magnitude $R_o=\sqrt{3}/2$, the maximum negative value of the resistance will be $$R_{max}=-9/4 \quad (8)$$

Figure 3:
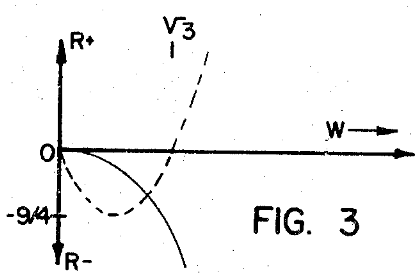
FIG. 3 is a graphical illustration of the frequency behavior of the negative resistance when practicing the present invention.

The magnitude of the resistive part $R_o$ of the input impedance will then become less negative for increasing angular frequency $\omega$. The magnitude becomes zero for $\omega=\sqrt{3}$, and will be positive at higher frequencies as shown by the plot of FIG. 3.

Because the negative excursion of the resistance $R_o$ is bounded, a small positive resistance in the external circuit of the gyrator will produce unconditional stability at all frequencies.

Figure 2:
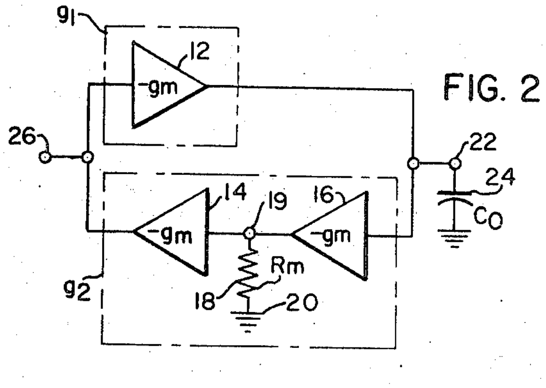
FIG. 2 is a schematic diagram of an illustrious embodiment of the present invention.
Figure 4:
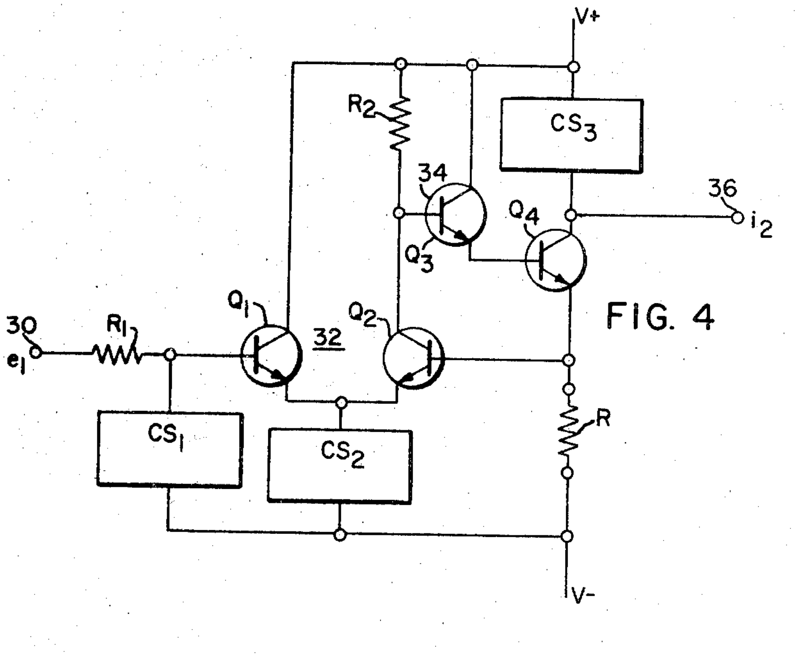
FIG. 4 is an electrical schematic diagram of circuit implementation of the present invention.

An amplifier capable of ready reduction to monolithic form for use in triplicate in accordance with the illustration of FIG. 2 is presented in FIG. 4. The input voltage $e_1$ at 30 drives a modified differential amplifier 32, so that the amplified voltage appears at the base of transistor 34. Transistor 34 provides an adequate base to collector DC voltage for the transistor $Q_2$. The transistor 34 also serves to unload the output of the differential amplifier 32, and to increase the feedback voltage. Transistor 34 drives the output transistor $Q_4$. Since the collector impedance of the transistor $Q_4$ is very high, typically about 20 megohms, and since the impedance of the current source, $CS_3$, is of about the same magnitude, the output current $i_2$ behaves in the proper fashion. That is, an output current $i_2$, at an impedance level about 10 megohms, is provided which is proportional to the input voltage $e_1$. An essential feature of this circuit is that the emitter signal voltage of transistor $Q_4$, which is very nearly equal to the base signal voltage of transistor 34, is suitable for negative feedback. All of this voltage is fed back to the differential amplifier 32 at the base of the transistor $Q_2$. This feedback voltage is proportional to the output current, $i_2$. It serves to increase the linearity and the thermal stability of the ratio $i_2/e_1$.

Since the output current $i_2$ is approximately equal to $-e_1/R$ the resistor $R$ may, when desired, be external to the integrated circuit chip. In such a manner the user will have the opportunity to supply a stable resistor $R$ of his own choosing to obtain any desired temperature coefficient.

Dependence of $i_2/e_1$ on diffused resistor ratios must also be avoided for high stability. Accordingly, the transistor $Q_1$ is biased with resistor $R_1$ and the current source $CS_1$ for zero direct current at both input and output. From the input terminal 30, the impedance of the current source $CS_1$ is in the order of megohms. Since resistor $R_1$ is less than 10,000 ohms, the signal attenuation is very small, and so does not depend on diffused resistors, or on their ratios.

Accordingly, the circuitry of FIG. 4 may be utilized in monolithic form with the resistor $R$, when desired being external to the chip. For the amplifier 16 of FIG. 2, the resistor 18 having a magnitude $R_m$ will be chosen to connect the output terminal 36 to the point of reference potential 20.

While the present invention has been described with a degree of particularity for the purposes of illustrations, it is to be understood that all modifications, alterations and substitutions within the spirit and scope of the present invention are herein meant to be included.

I claim as my invention:

1. A gyrator comprising, in combination: first, second and third amplifiers with substantially the same single dominant pole and each being of the inverting type with high input and output impedance; said second and third amplifiers being connected in cascade combination directly between input and output terminals of said first amplifier, said terminals also being the input and output terminals of the gyrator; and a gain-controlling resistor connecting the common junction of said second and third amplifiers to a point of reference potential.

2. The combination of claim 1 wherein said first amplifier provides an inverting transconductance; said second and third amplifiers connected in cascade providing a noninverting transconductance.

3. The combination of claim 2 wherein said gain-controlling resistor is selected to provide said transconductance of opposite sense to be directly proportional to the magnitude of said resistor.

4. The combination of claim 1 wherein said gain-controlling resistor is a positive valued resistor external to the circuit of the gyrator and being of a magnitude of 9/4 ohms or less connected in circuit combination with the resistive port of the input impedance for a unitized frequency to reduce the negative excursion of the resistance of the gyrator whereby stability is attained at all frequencies.

* * * * *